United States Patent
Chang et al.

(10) Patent No.: US 8,410,965 B2
(45) Date of Patent: Apr. 2, 2013

(54) DYNAMIC ELEMENT MATCHING METHOD AND SYSTEM THEREOF

(75) Inventors: Jung-Kuei Chang, Hsinchu Hsien (TW); Huang-Hsiang Lin, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 138 days.

(21) Appl. No.: 13/026,404

(22) Filed: Feb. 14, 2011

(65) Prior Publication Data

US 2011/0227629 A1      Sep. 22, 2011

(30) Foreign Application Priority Data

Mar. 22, 2010   (TW) ................ 99108341 A

(51) Int. Cl.
*H03M 1/66*    (2006.01)

(52) U.S. Cl. ...................... 341/144; 341/143

(58) Field of Classification Search .......... 341/143, 341/144
See application file for complete search history.

(56) References Cited

U.S. PATENT DOCUMENTS

| | | | | |
|---|---|---|---|---|
| 6,522,277 B2 * | 2/2003 | Fujimori et al. | ............. | 341/144 |
| 6,535,155 B2 * | 3/2003 | Ruha et al. | ................... | 341/144 |
| 7,199,741 B2 * | 4/2007 | Clara et al. | ................... | 341/144 |
| 7,463,175 B2 * | 12/2008 | Kim | ........................... | 341/126 |
| 7,561,088 B1 * | 7/2009 | Ferguson | ..................... | 341/144 |
| 7,808,409 B2 * | 10/2010 | Kim | ........................... | 341/126 |
| 8,094,052 B2 * | 1/2012 | Dabag et al. | ................ | 341/144 |

* cited by examiner

*Primary Examiner* — Khai M Nguyen
(74) *Attorney, Agent, or Firm* — Edell, Shapiro & Finnan, LLC

(57) ABSTRACT

A dynamic element matching method and system thereof is provided. The method includes grouping a plurality of switches into a plurality of groups; allocating a plurality of to-be-turned-on switches of the switches for an input signal to the groups; and maintaining a switch activity of each of the groups at a predetermined value. Accordingly, mismatch noise and harmonic noise are effectively reduced.

18 Claims, 7 Drawing Sheets

DYNAMIC ELEMENT MATCHING METHOD AND SYSTEM THEREOF

CROSS REFERENCE TO RELATED PATENT APPLICATION

This patent application is based on Taiwan, R.O.C. patent application No. 099108341 filed on Mar. 22, 2010.

FIELD OF THE INVENTION

The present invention relates to a dynamic element matching (DEM) technique, and more particularly, to a DEM system applied to a multi-bit Sigma-Delta ($\Sigma$-$\Delta$) modulator and method thereof.

BACKGROUND OF THE INVENTION

A $\Sigma$-$\Delta$ modulator is widely implemented in connection with data conversion, e.g., the $\Sigma$-$\Delta$ modulator can be used in a digital-to-analog converter (DAC) or an analog-to-digital converter (ADC). The $\Sigma$-$\Delta$ modulator is classified as two types—a single-bit $\Sigma$-$\Delta$ modulator or a multi-bit $\Sigma$-$\Delta$ modulator. Since quantization noise of the multi-bit $\Sigma$-$\Delta$ modulator is much smaller than that of the single-bit $\Sigma$-$\Delta$ modulator, the multi-bit $\Sigma$-$\Delta$ modulator is more frequently employed. However, due to fabrication process differences between DACs or ADCs, mismatch noises or errors occur. In view of the foregoing description, a DEM mechanism is developed to reduce mismatch noises for noise-shaping. FIG. 1 shows a block diagram of a $\Sigma$-$\Delta$ modulator 10, a DEM 12 and a DAC 14. The DEM 12 comprises a plurality of controlled switches. The DEM 12 turns on or off the switches according to an output signal from the $\Sigma$-$\Delta$ modulator 10 so as to reduce mismatch noises.

In a conventional DEM mechanism, a dynamic weighting average (DWA) selectively turns on/off switches via a continuous alternative approach according to the number of to-be-turned-on switches. Table 1 illustrates an example of ten switches of which to-be-turned-on switches are marked by "V" and to-be-turned-off switches are not marked.

TABLE 1

| Number of on/off Switches | 1 | 2 | 3 | 4 | 5 | 6 | 7 | 8 | 9 | 10 | Motion Activity |
|---|---|---|---|---|---|---|---|---|---|---|---|
| 3 | V | V | V | | | | | | | | — |
| 5 | | | | V | V | V | V | V | | | 8 |
| 2 | | | | | | | | | V | V | 7 |
| 8 | V | V | V | V | V | V | V | V | | | 10 |
| 7 | V | V | V | V | V | | | | V | V | 3 |

In this example, at the beginning, the first three switches are turned on. After that, a continuous series of five switches is turned on. The first switch is to be turned on until all of the ten switches are in sequence turned on once. A final item of Table 1 illustrates a switch activity representing the number of switches of which on/off statuses are changed when a previous signal traverses to a current signal. That is, the number of switches of which on/off statuses are changed is equal to the number of switches changing from being turned on to turned off adding to the number of switches changing from being turned off to turned on. For example, when a signal amplitude is large and is around a maximum point and a minimum point of a signal, the switch activity is small; when the signal amplitude is between the maximum point and the minimum point of the signal, the switch activity is large.

Although the foregoing conventional DWA technique is simple and is easily implemented, harmonic noise is created due to large switch activity when the conventional DWA technique is applied to a signal with large amplitude. The harmonic noises related with signal amplitude is also referred to as signal-related harmonic noises.

In view of the conventional DEM technique that cannot reduce mismatch noise, a novel DEM system and method thereof capable of maintaining DEM noise-shaping as well as reducing harmonic noise related with a signal with large amplitude is in need.

SUMMARY OF THE INVENTION

One object of the present invention is to provide a DEM system and method thereof applied to a multi-bit $\Sigma$-$\Delta$ modulator to effectively reduce mismatch noise and harmonic noise.

The present invention provides a DEM method comprising grouping a plurality of switches into a plurality of groups; allocating a plurality of to-be-turned-on switches of the switches for an input signal to the groups; and maintaining a switch activity for each group substantially at a predetermined value.

The present invention also provides a DEM system comprising a plurality of switches, an allocating apparatus, and an activity control device. The switches are grouped into a plurality of groups each having a same number of switches. The allocating apparatus generates an allocation result to averagely allocate a plurality of to-be-turned-on switches for an input signal to the groups. The activity control device maintains a switch activity for each group substantially at a predetermined value according to the allocation result of the allocating apparatus.

DETAILED DESCRIPTION OF THE PREFERRED EMBODIMENT

Figure 1:
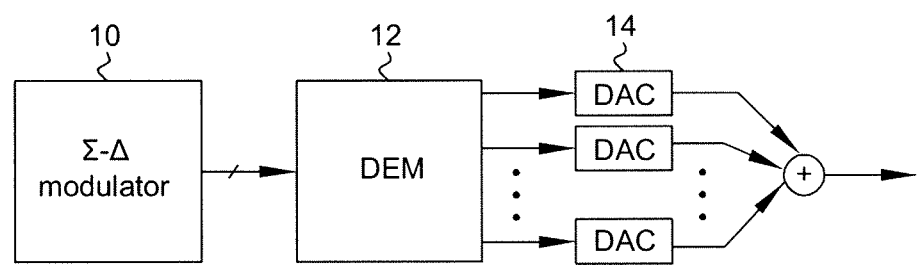
FIG. 1 is a block diagram of a $\Sigma$-$\Delta$ modulator, a DEM system and a DAC in the prior art.
Figure 2:
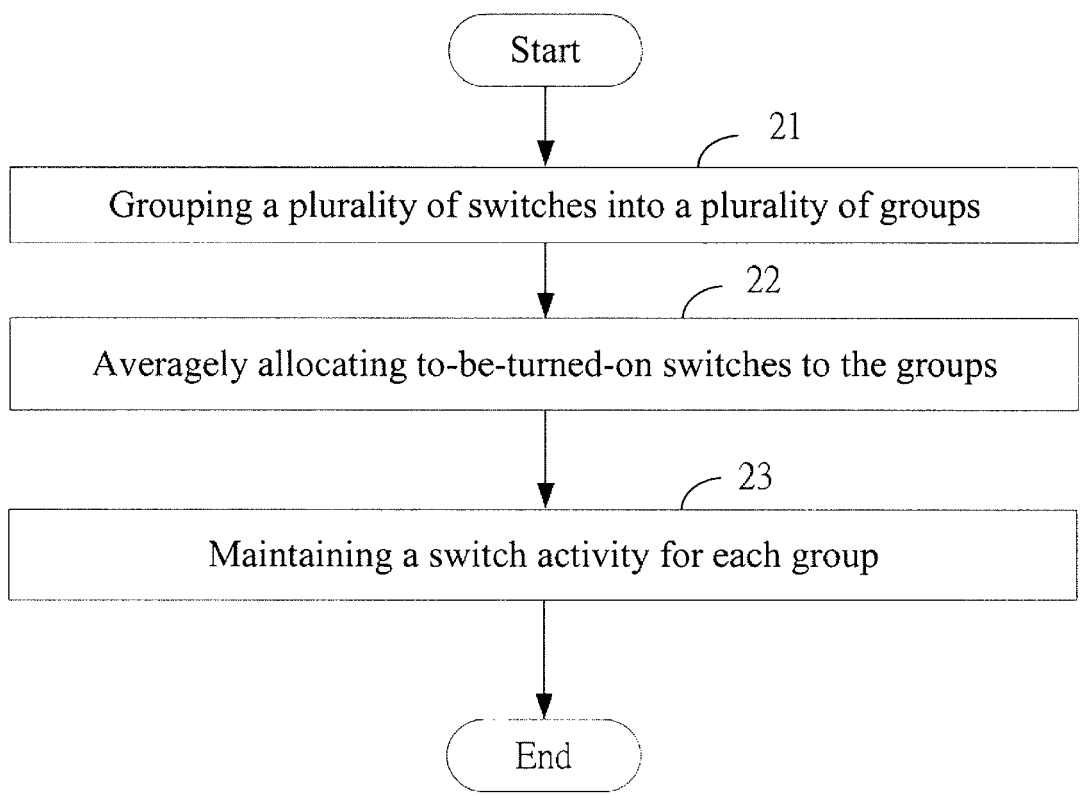
FIG. 2 is a flow chart of a DEM method in accordance with an embodiment of the present invention.
Figure 3:
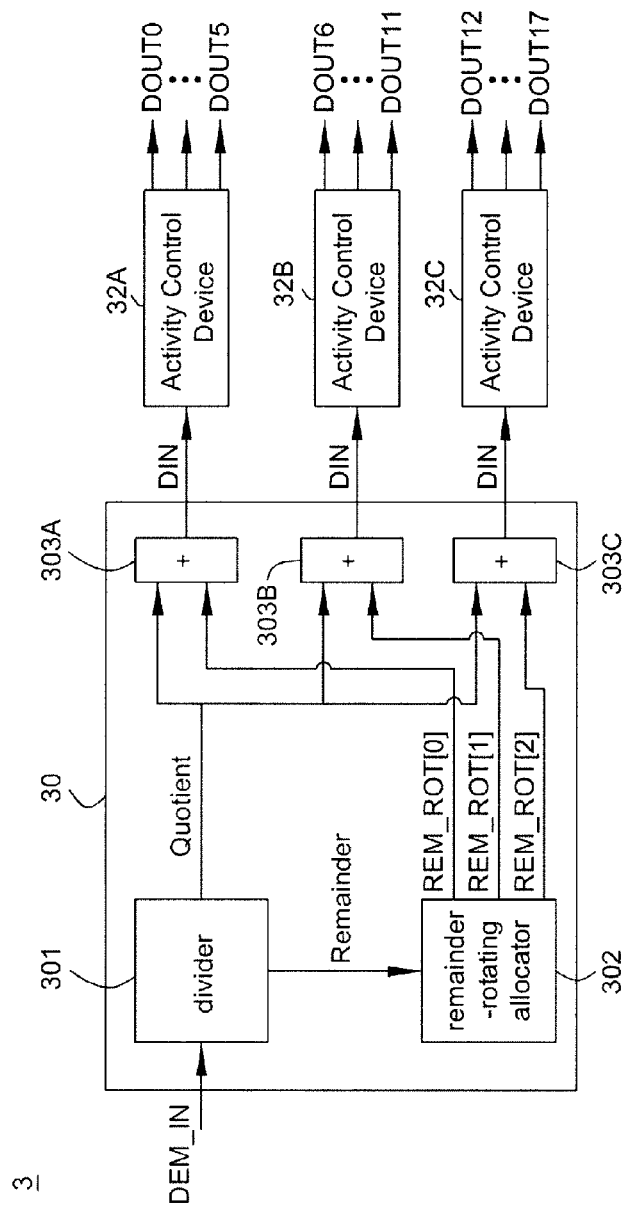
FIG. 3 is a block diagram of a DEM system in accordance with an embodiment of the present invention.

FIG. 2 shows a flow chart of a DEM method in accordance with an embodiment of the present invention. FIG. 3 is a block diagram of a DEM system 3 in accordance with an embodiment of the present invention. The DEM system 3 receives an output signal of a multi-bit $\Sigma$-$\Delta$ modulator, e.g., an audio signal or a video signal. An output signal of the DEM system 3 is fed to a DAC to reduce mismatch errors or noise for noise-shaping. In this embodiment, the number of switches of the DEM system 3 is 18 for the following explanation.

Figure 4:
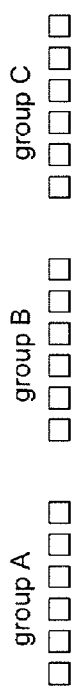
FIG. 4 is a schematic diagram of a tree structure formed by groups A, B and C.

In Step 21, the switches (or most switches) are grouped into a plurality of groups. In this embodiment, the 18 switches are grouped into three groups. Therefore, each of the groups has six switches. FIG. 4 shows a tree structure associated with groups A, B and C, and each block represents one switch.

In Step 22, the to-be-turned-on switches are allocated by the allocating apparatus 30 to each of the groups according to the number of to-be-turned-on switches required by an input signal DEM_IN, and the number of to-be-turned-on switches of each group is represented by a signal DIN. In this embodiment, the to-be-turned-on switches are substantially averagely allocated to all groups. Remaining switches after the allocation are again averagely allocated to a portion of groups. For example, after initialization, when the number of to-be-turned-on switches for the input signal at a first time is 7, two switches are allocated to each of the groups A, B and C since 7 divided by 3 is 2 with a remainder 1. The remaining one switch is allocated to the group A. When the number of to-be-turned-on switches for the input signal at a second time is 8, two switches are allocated to each of the groups A, B and C since 8 divided by 3 is 2 with a remainder 2. The remaining two switches are in turn allocated to the groups B and C since the group A has been allocated for the previous remainder.

Referring to FIG. 3, the allocating apparatus 30 obtains a quotient and a remainder utilizing a divider 301 according to the number of to-be-turned-on switches and the number of groups for the input signal DEM_IN. The remainder is alternately averagely allocated to partial groups by a remainder-rotating allocator 302. In this embodiment, the divider 301 is realized by a lookup table. The quotient generated by the divider 301 and the output signals REM_ROT[0], REM_ROT[1] and REM_ROT[2] generated by the remainder-rotating allocator 302 are respectively received by adders 303A, 303B and 303C to generate partial output signals DIN for the groups A, B and C. Accordingly, each of the groups obtains the number of to-be-turned-on switches for each group according to the signals DIN.

Referring to FIG. 2, in Step 23, a switch activity for each group is maintained at a substantially constant value. In one embodiment, the switch activity is maintained at half of the number of the switches for each group. For the tree structure in FIG. 4, the switch activity of each group is maintained at three, i.e., there are three switches of which on/off statuses are changed when a previous signal traverses to a current signal. Under some situations, the switch activity can be two or four.

In this embodiment, an overlapping approach is applied to maintain the switch activity. Table 2 illustrates one group comprising six switches of which to-be-turned-on switches are marked by "V" and to-be-turned-off switches are not marked.

TABLE 2

| Signal | Number of to-be-turned-on Switches | 1 | 2 | 3 | 4 | 5 | 6 | Switch Activity |
|---|---|---|---|---|---|---|---|---|
| a | 1 | V | | | | | | — |
| b | 2 | | V | V | | | | 3 |
| c | 2 | | | V | V | | | 2 |
| d | 3 | | | | V | V | V | 3 |
| e | 4 | V | V | | | V | V | 3 |

In this embodiment, a signal c requires two to-be-turned-on switches (i.e., switches 3 and 4). When a signal d is received, since there are three to-be-turned-on switches, a switch needs to be overlapped (e.g., the switch 4) to maintain the switch actively at three, such that an on/off status of the switch 4 stays unchanged and on/off statuses of switches 3, 5 and 6 are changed. When a signal e is received, there are four to-be-turned-on switches, and two switches (e.g., the switches 5 and 6) are overlapped to maintain the switch activity at three, such that the on/off statuses of the switches 5 and 6 remain unchanged, and the on/off statuses of the switches of the switches 1, 2 and 4 are changed.

In this embodiment, a counter recording a switch history or weighting of each switch and a sorting technique are applied to determine which switch(es) is/are to be changed or overlapped. For example, the sorting technique, a complete sorting approach, sorts a switch having a least switch history or a smallest weighting at the beginning of a sequence, i.e., the switch is provided with a highest priority for changing its on/off status.

Referring to FIG. 3, activity control device 32A, 32B and 32C for the groups A, B and C respectively perform the foregoing weighting recording and sorting, and respectively determine an on/off status for the switches according to the output signals DIN of the allocation apparatus 30. The on/off status for the switches is represented by DOUT0-5, DOUT6-11 and DOUT12-17.

Figure 5:
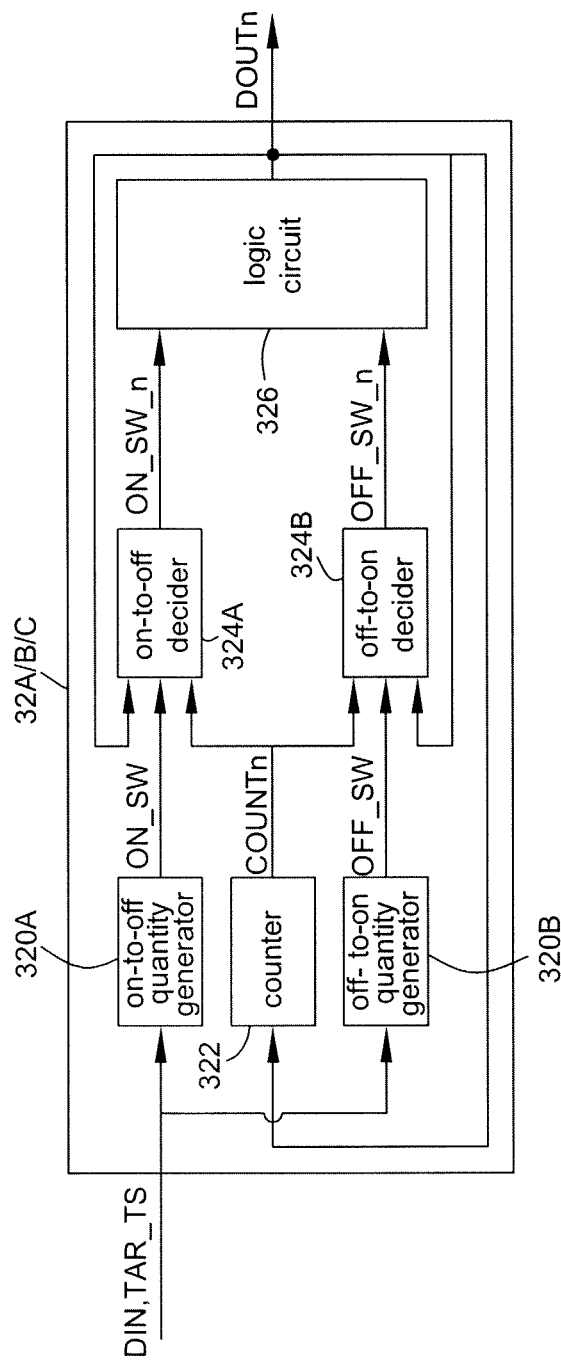
FIG. 5 is a block diagram of an activity control device in accordance with an embodiment of the present invention.

FIG. 5 shows a detailed circuit of activity control devices 32A, 32B and 32C in accordance with an embodiment of the present invention. An on-to-off quantity generator 320A generates a switch number ON_SW of switches to be turned off according to input signals DIN from the allocating apparatus 30 and a switch activity target value TAR_TS. In this embodiment, referring to FIG. 4, the switch activity target value TAR_TS is three. Likewise, an off-to-on quantity generator 320B generates a switch number OFF_SW of switches to be turned on according to the input signals DIN from the allocating apparatus 30 and the switch activity target value TAR_TS. As illustrated in Table 2, the on-to-off switch number ON_SW and the off-to-on switch number OFF_SW are generated according to the overlapping approach.

In this embodiment, the activity control devices 32A, 32B and 32C further comprise a counter 322, which records a switch history and weighting of each switch via a count value COUNTn.

An on-to-off decider 324A determines which one or which switches are to be turned off according to the on-to-off switch number ON_SW received from the on-to-off quantity generator 320A, the count value COUNTn, and a previous output signal DOUTn. Similarly, an off-to-on decider 324B determines which switch(es) are to be turned on according to the off-to-on switch number OFF_SW received from the off-to-on quantity generator 320B, the count value COUNTn, and the previous output signal DOUTn.

Figure 6:
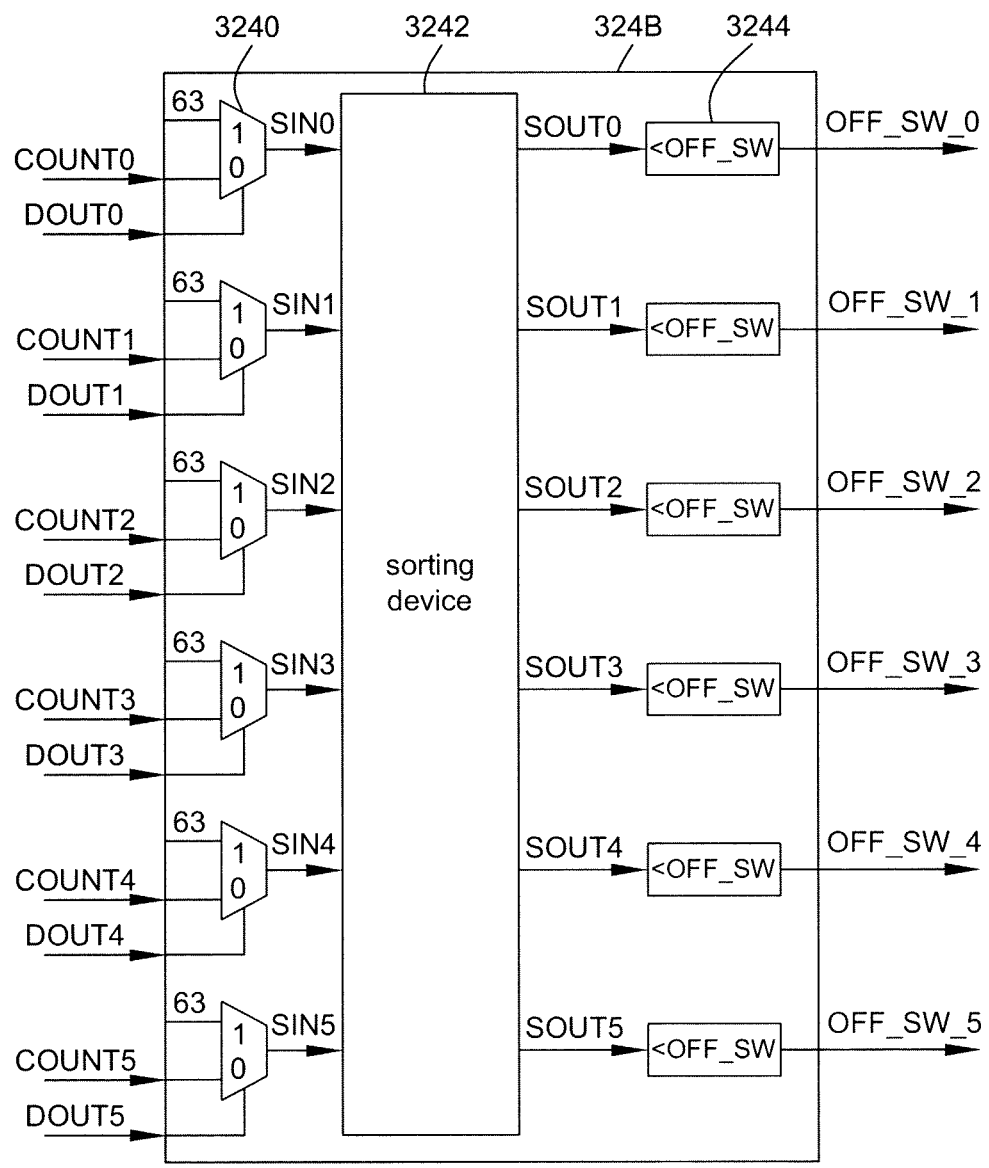
FIG. 6 is a detailed circuit of an on-to-off status decider in accordance with an embodiment of the present invention.

As mentioned above, the foregoing determinations are performed via the sorting approach. FIG. 6 shows a block diagram of a detailed circuit of the off-to-on decider 324B in accordance with an embodiment of the present invention. Operations of the off-to-on decider 324B are described with reference to Table 3. A structure and operations of the on-to-off decider 324A are similar to those of the off-to-on decider 324B, and shall not be described for brevity.

TABLE 3

| | Sequence Number | | | | | |
|---|---|---|---|---|---|---|
| n | 0 | 1 | 2 | 3 | 4 | 5 |
| Count Value COUNTn | 4 | 5 | 3 | 2 | 2 | 2 |
| Previous Status DOUTn | 1 | 0 | 0 | 0 | 1 | 1 |

TABLE 3-continued

| | Sequence Number | | | | | |
| --- | --- | --- | --- | --- | --- | --- |
| n | 0 | 1 | 2 | 3 | 4 | 5 |
| Sorting Output SOUTn | 3 | 2 | 1 | 0 | 4 | 5 |
| OFF_SW_n | 0 | 0 | 1 | 1 | 0 | 0 |

Suppose that the off-to-on switch number FF_SW is equal to 2. When the previous status signal DOUTn has an on status (i.e., "1"), a multiplexer 3240 outputs a large value, e.g. 63, to a sorting device 3242; when the previous status signal DOUTn has an off status (i.e., "1"), the multiplexer 3240 passes the count value COUNTn to the sorting device 3242 for sorting. The sorting device sorts input values SINn to generate sorted output values SOUTn. The off-to-on switch number OFF_SW (i.e., 2 in this embodiment) is compared with the sorted output values SOUTn via a comparator 3244. In this embodiment, only the first two sorted output values (i.e., SOUTn="0", "1") generate active outputs (i.e., OFF_SW_n="1"), i.e., only the two switches corresponding to the first two sorted output values are turned on. A logical circuit 326 generates output signals DOUTn according to ON_SW_n and OFF_SW_n respectively outputted by the off-to-on decider 324A and the off-to-on decider 324B to control to turn on or turn off each switch.

Figure 7A:
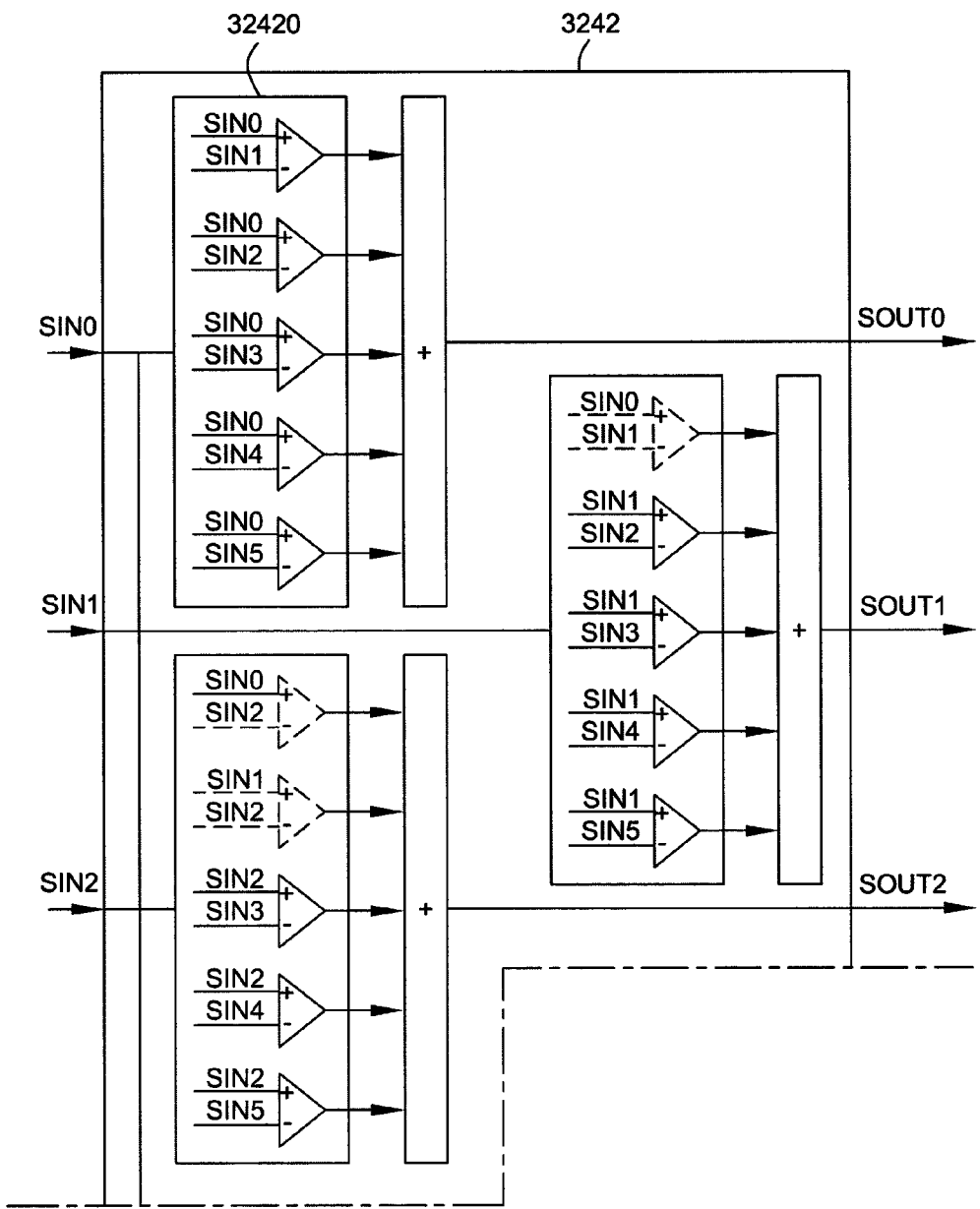
FIGS. 7A and 7B show a detailed circuit of a sorting device in accordance with an embodiment of the present invention.
Figure 7B:
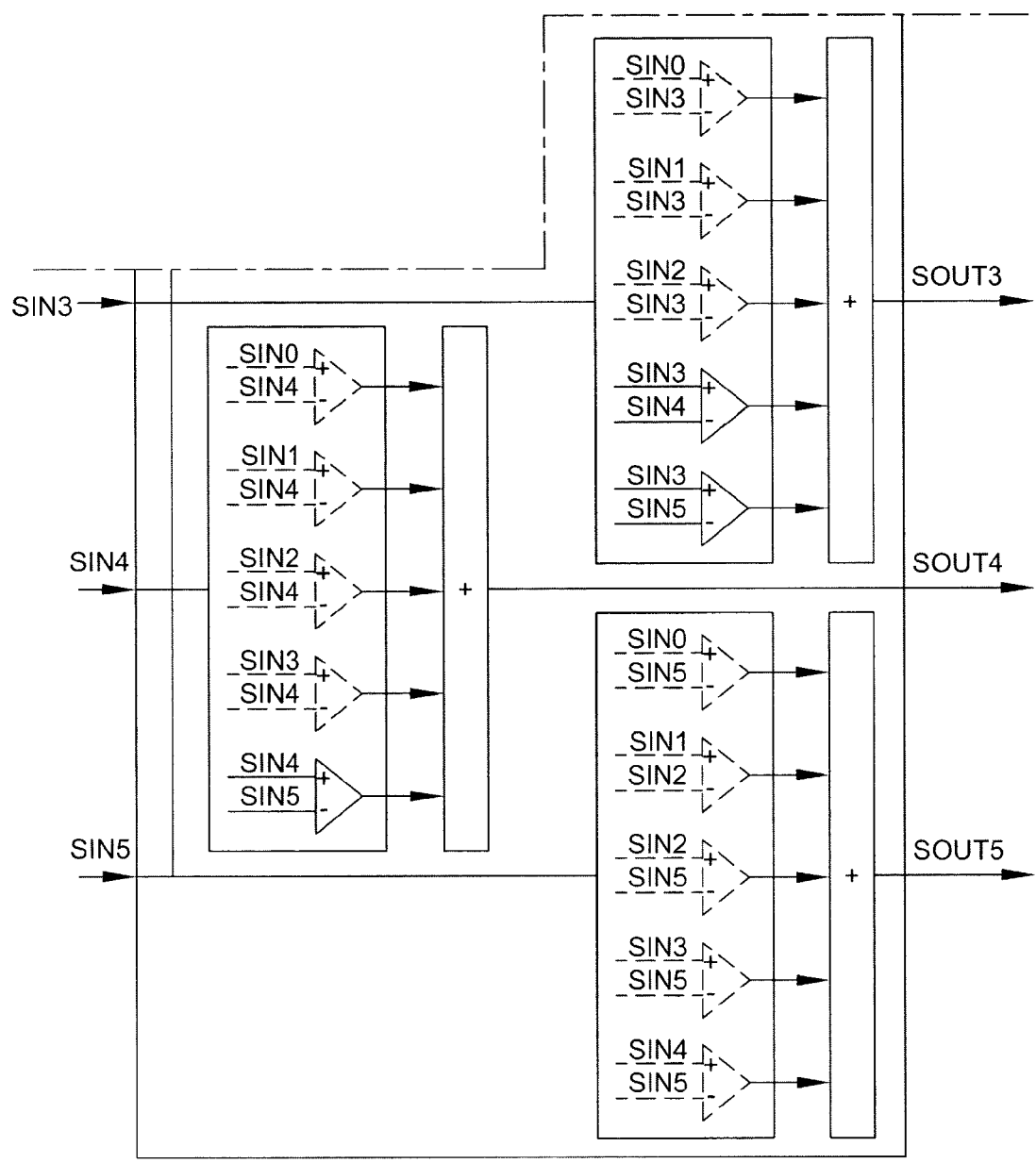

FIGS. 7A and 7B show a detailed circuit of the sorting device 3242, utilizing a complete sorting approach, in FIG. 6, in accordance with an embodiment of the present invention. Every two input values SINn are compared by a comparing device 32420. In this embodiment, each group has six input values, 15 (i.e., $C_2^6=15$) comparators are utilized for each group. Three groups may require 45 comparators. However, comparators depicted by dashed lines can share the comparators depicted by solid lines in FIGS. 7A and 7B. It should be noted that, if the 18 switches are not grouped, the number of comparing device 32420 required to sort the 18 switches reaches as much as 153 (i.e., $C_2^{18}=153$). Accordingly, advantages of grouping the switches simplify sorting complexity and the number of hardware comparators required for sorting and improve the signal quality.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A dynamic element matching (DEM) method, comprising:
grouping a plurality of switches into a plurality of groups;
allocating a plurality of to-be-turned-on switches among the switches for an input signal to the groups; and
maintaining a switch activity for each group including:
recording a switch history for each switch by a plurality of weightings;
sorting the weightings; and
determining a plurality of statuses for the switches according to the sorted weightings.

2. The method as claimed in claim 1, wherein the maintaining step substantially maintains the switch activity at a predetermined value.

3. The method as claimed in claim 1, wherein the groups form a tree structure.

4. The method as claimed in claim 1, wherein the to-be-turned-on switches are averagely allocated to all of the groups, and a plurality of remaining switches of the switches is averagely allocated to a plurality of partial groups of the groups.

5. The method as claimed in claim 1, wherein the maintaining step substantially maintains the switch activity at half of the number of switches of each group.

6. The method as claimed in claim 1, wherein the maintaining step maintains the switch activity for each group utilizing an overlapping approach.

7. The method as claimed in claim 1, wherein the sorting step sorts the weightings utilizing a complete sorting approach.

8. The method as claimed in claim 1, wherein a switch with a smallest weighting among the switches is assigned with a highest priority.

9. The method as claimed in claim 1, wherein the allocating step averagely allocates the to-be-turned-on switches for the input signal to the groups.

10. A dynamic element matching (DEM) system, comprising:
a plurality of switches associated with a plurality of groups;
an allocating apparatus, for allocating a plurality of to-be-turned-on switches among the switches for an input signal to the groups; and
a plurality of switch activity control devices, coupled to the allocating apparatus, for maintaining a switch activity for each group, wherein each activity control device comprises:
a counter, for counting a plurality of count values for a plurality of weightings for the switches, respectively;
an on-to-off quantity generator, for generating a switch number for to-be-turned-off switches according to outputs of the allocating apparatus and the switch activity;
an off-to-on quantity generator, for generating a switch number for to-be-turned-on switches according to outputs of the allocating apparatus and the switch activity;
an on-to-off decider, for determining which switches need to be turned off according to the switch number of the to-be-turned-off switches and a previous output signal of the activity control device;
an off-to-on decider, for determining which switches need to be turned on according to the switch number of the to-be-turned-on switches and the previous output signal of the activity control device; and
a logical circuit, coupled to the on-to-off decider and the off-to-on decider, for generating an output signal of the activity control device to turn on or turn off the switches.

11. The DEM system as claimed in claim 10, wherein the switch activity is substantially maintained at a predetermined value.

12. The DEM system as claimed in claim 10, wherein the switch activity equals to half of the number of switches of each group.

13. The DEM system as claimed in claim 10, wherein the allocating apparatus comprises:
a divider, for dividing a first number of to-be-turned-on switches by a number of groups to obtain a quotient and a remainder, wherein the quotient represents a second number of to-be-turned-on switches that are allocated to each group;

a remainder-rotating allocator, for generating a plurality of outputs for a plurality of partial groups among the groups according to the remainder;

a plurality of adders, for respectively adding the outputs of the remainder-rotating allocator with the quotient.

14. The DEM system as claimed in claim 10, wherein the on-to-off decider or the off-to-on decider further comprises a sorting device for sorting weightings of switches.

15. The DEM system as claimed in claim 14, wherein the sorting is realized via a complete sorting approach.

16. The DEM system as claimed in claim 14, wherein the sorting device comprises a plurality of comparators for respectively comparing two weightings.

17. The DEM system as claimed in claim 10, wherein each of the groups comprises a same number of switches.

18. The DEM system as claimed in claim 10, wherein the allocating apparatus averagely allocates the to-be-turned-on switches for the input signal to the groups.

* * * * *